(12) United States Patent
Kano

(10) Patent No.: US 12,308,841 B2
(45) Date of Patent: May 20, 2025

(54) CIRCUIT DEVICE AND OSCILLATOR

(71) Applicant: SEIKO EPSON CORPORATION, Tokyo (JP)

(72) Inventor: Shinnosuke Kano, Minowa (JP)

(73) Assignee: SEIKO EPSON CORPORATION (JP)

( * ) Notice: Subject to any disclaimer, the term of this patent is extended or adjusted under 35 U.S.C. 154(b) by 0 days.

(21) Appl. No.: 18/506,460

(22) Filed: Nov. 10, 2023

(65) Prior Publication Data
US 2024/0162892 A1 May 16, 2024

(30) Foreign Application Priority Data

Nov. 11, 2022 (JP) .................. 2022-180838

(51) Int. Cl.
*H03K 3/03* (2006.01)
*G01R 19/252* (2006.01)
*H03M 1/60* (2006.01)

(52) U.S. Cl.
CPC ......... *H03K 3/0315* (2013.01); *G01R 19/252* (2013.01); *H03M 1/60* (2013.01)

(58) Field of Classification Search
CPC ........ H03M 1/60; H03M 1/62; G01R 19/252; H03K 3/0315
See application file for complete search history.

(56) References Cited

U.S. PATENT DOCUMENTS

| | | | |
|---|---|---|---|
| 2002/0060638 A1* | 5/2002 | Nishii | H03M 1/14 341/157 |
| 2014/0008984 A1 | 1/2014 | Kamiyama et al. | |
| 2016/0109932 A1* | 4/2016 | Jeon | G06F 1/3296 713/323 |
| 2016/0336955 A1* | 11/2016 | Matsuzawa | H03F 3/45179 |
| 2020/0059239 A1* | 2/2020 | Deutscher | H03M 1/164 |
| 2020/0089299 A1* | 3/2020 | Kim | H03L 7/097 |

FOREIGN PATENT DOCUMENTS

| | | | | |
|---|---|---|---|---|
| JP | 2014-017965 A | | 1/2014 | |
| WO | WO-2011128419 A1 * | 10/2011 | | G01R 23/10 |
| WO | WO-2017023418 A1 * | 2/2017 | | G01K 7/32 |

* cited by examiner

*Primary Examiner* — Ryan Johnson
(74) *Attorney, Agent, or Firm* — Harness, Dickey & Pierce, P.L.C.

(57) ABSTRACT

A circuit device according to the embodiment includes an oscillation circuit, a current supply circuit, a counter circuit, and a calculation circuit. An oscillation frequency of the oscillation circuit changes according to a supply current. The current supply circuit supplies, to the oscillation circuit, a first current that changes according to a detection target voltage. The counter circuit performs a count process of counting an output signal of the oscillation circuit in a given period. The calculation circuit performs a voltage calculation process of calculating detection voltage data corresponding to the detection target voltage based on a first count value obtained in the count process in a state in which the first current is supplied to the oscillation circuit.

14 Claims, 14 Drawing Sheets

CIRCUIT DEVICE AND OSCILLATOR

The present application is based on, and claims priority from JP Application Serial Number 2022-180838, filed Nov. 11, 2022, the disclosure of which is hereby incorporated by reference herein in its entirety.

BACKGROUND

1. Technical Field

The present disclosure relates to a circuit device, an oscillator, and the like.

2. Related Art

JP-A-2014-017965 discloses a power supply switching circuit and a real-time clock device. In the power supply switching circuit or the like, a power supply is switched based on a determination result of a power supply monitoring circuit.

The power supply switching circuit or the like disclosed in JP-A-2014-017965 detects a change in a power supply voltage by dividing the power supply voltage and comparing the divided voltage with a reference voltage. Therefore, there is a problem that detection accuracy is restricted by performance of an analog circuit.

SUMMARY

An aspect of the present disclosure relates to a circuit device. The circuit device includes: an oscillation circuit whose oscillation frequency changes according to a supply current; a current supply circuit configured to supply, to the oscillation circuit, a first current that changes according to a detection target voltage as the supply current; a counter circuit configured to perform a count process of counting an output signal of the oscillation circuit in a given period; and a calculation circuit configured to perform a voltage calculation process of calculating detection voltage data corresponding to the detection target voltage based on a first count value obtained in the count process in a state in which the first current is supplied to the oscillation circuit.

Another aspect of the present disclosure relates to an oscillator including: the circuit device described above; and a resonator configured to generate a setting clock signal of the given period.

DESCRIPTION OF EMBODIMENTS

Hereinafter, the embodiment will be described. The embodiment to be described below does not unduly limit contents described in the claims. In addition, all of the components described in the embodiment are not necessarily essential components.

1. Circuit Device

Figure 1:
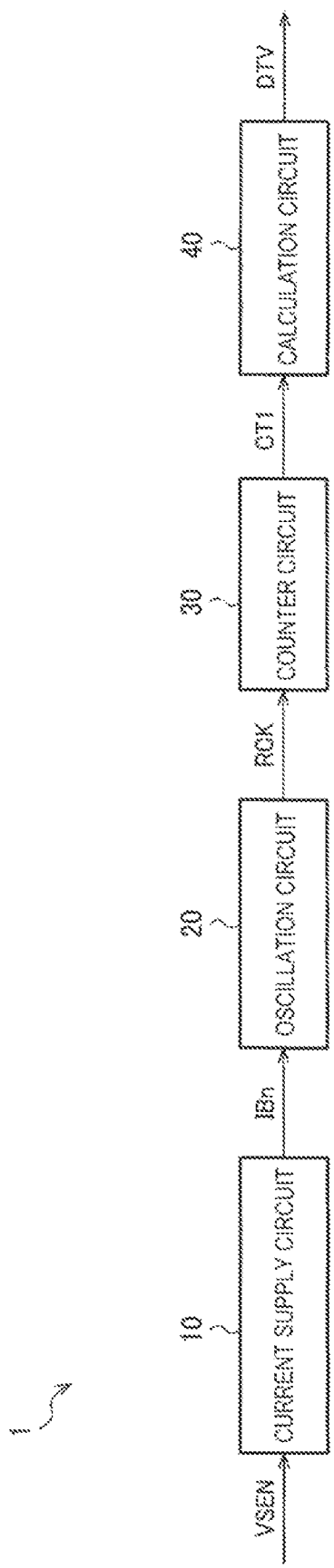
FIG. 1 shows a configuration example of a circuit device according to the embodiment.
Figure 4:
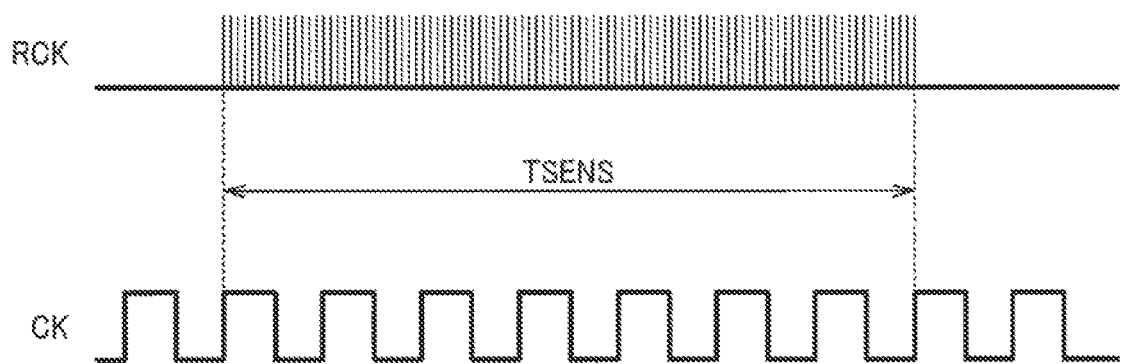
FIG. 4 is a diagram showing a method of a count process of the number of pulses.

FIG. 1 shows a configuration example of a circuit device 1 according to the embodiment. The circuit device 1 according to the embodiment includes a current supply circuit 10, an oscillation circuit 20, a counter circuit 30, and a calculation circuit 40. The circuit device 1 is an integrated circuit device referred to as an integrated circuit (IC). For example, the circuit device 1 is an IC manufactured by a semiconductor process and is a semiconductor chip in which a circuit element is formed on a semiconductor substrate. The circuit device 1 operates as a voltage detection circuit utilizing the fact that an oscillation frequency of, for example, a ring oscillator has temperature dependence and voltage dependency, as shown in FIG. 4 to be described later.

The current supply circuit 10 supplies a first current, which changes according to a detection target voltage VSEN, to the oscillation circuit 20 as a supply current IBn.

The oscillation circuit 20 is an oscillation circuit whose oscillation frequency changes according to the supply current IBn. For example, the oscillation circuit 20 outputs a clock signal RCK whose frequency changes according to the supply current IBn. The clock signal RCK is an oscillation clock signal. As the oscillation circuit 20, for example, the ring oscillator or the like can be used.

The counter circuit 30 performs a count process of counting the number of clocks for a given period on the clock signal RCK output from the oscillation circuit 20. Here, the given period can be freely set.

The calculation circuit 40 performs various calculation processes. The calculation circuit 40 can be implemented by a circuit of an application specific integrated circuit (ASIC) based on automatic placement and wiring such as a gate array. The calculation circuit 40 performs a voltage calculation process of calculating detection voltage data DTV corresponding to the detection target voltage VSEN based on a first count value CT1 obtained in the count process in which a first current IB1 is supplied to the oscillation circuit 20. The first count value CT1 is a count value corresponding to the first current IB1. The detection voltage data DTV is digital data representing a value of the detection target voltage VSEN.

As described above, the circuit device 1 according to the embodiment uses the detection target voltage VSEN as an input signal, obtains the first count value CT1 corresponding to the detection target voltage VSEN by processes in the current supply circuit 10, the oscillation circuit 20, and the counter circuit 30, and obtains and outputs the detection voltage data DTV corresponding to the detection target voltage VSEN from the first count value CT1.

That is, the circuit device 1 according to the embodiment includes the oscillation circuit 20, the current supply circuit 10, the counter circuit 30, and the calculation circuit 40. The oscillation frequency of the oscillation circuit 20 changes according to the supply current IBn. The current supply circuit 10 supplies the first current, which changes according to the detection target voltage VSEN, to the oscillation circuit 20 as the supply current IBn. The counter circuit 30 performs the count process of counting the output signal of the oscillation circuit 20 in the given period. The calculation circuit 40 performs the voltage calculation process of calculating the detection voltage data DTV corresponding to the detection target voltage VSEN based on the first count value obtained in the count process in a state in which the first current is supplied to the oscillation circuit 20.

In this manner, the first current that changes according to the detection target voltage VSEN is supplied to the oscillation circuit 20, the output signal of the oscillation circuit 20 whose oscillation frequency changes according to the first current is subjected to the count process in the given period, and the calculation process is performed based on the obtained first count value, so that the detection voltage data DTV corresponding to the detection target voltage VSEN can be calculated. For example, in the voltage detection circuit that compares the detection target voltage VSEN with a reference voltage by a comparator, there is a problem that it is difficult to adjust detection accuracy or widen a detection voltage range. In contrast, according to the circuit device 1 of the embodiment, the detection accuracy of the detection target voltage VSEN can be adjusted by, for example, setting a length of the given period in which the count process is performed or changing an algorithm of the calculation process in the calculation circuit. It is also possible to widen the detection voltage range as compared with the voltage detection circuit described above. Another advantage is that the detection accuracy is not restricted by performance of an analog circuit.

2. Detailed Configuration Example

Figure 2:
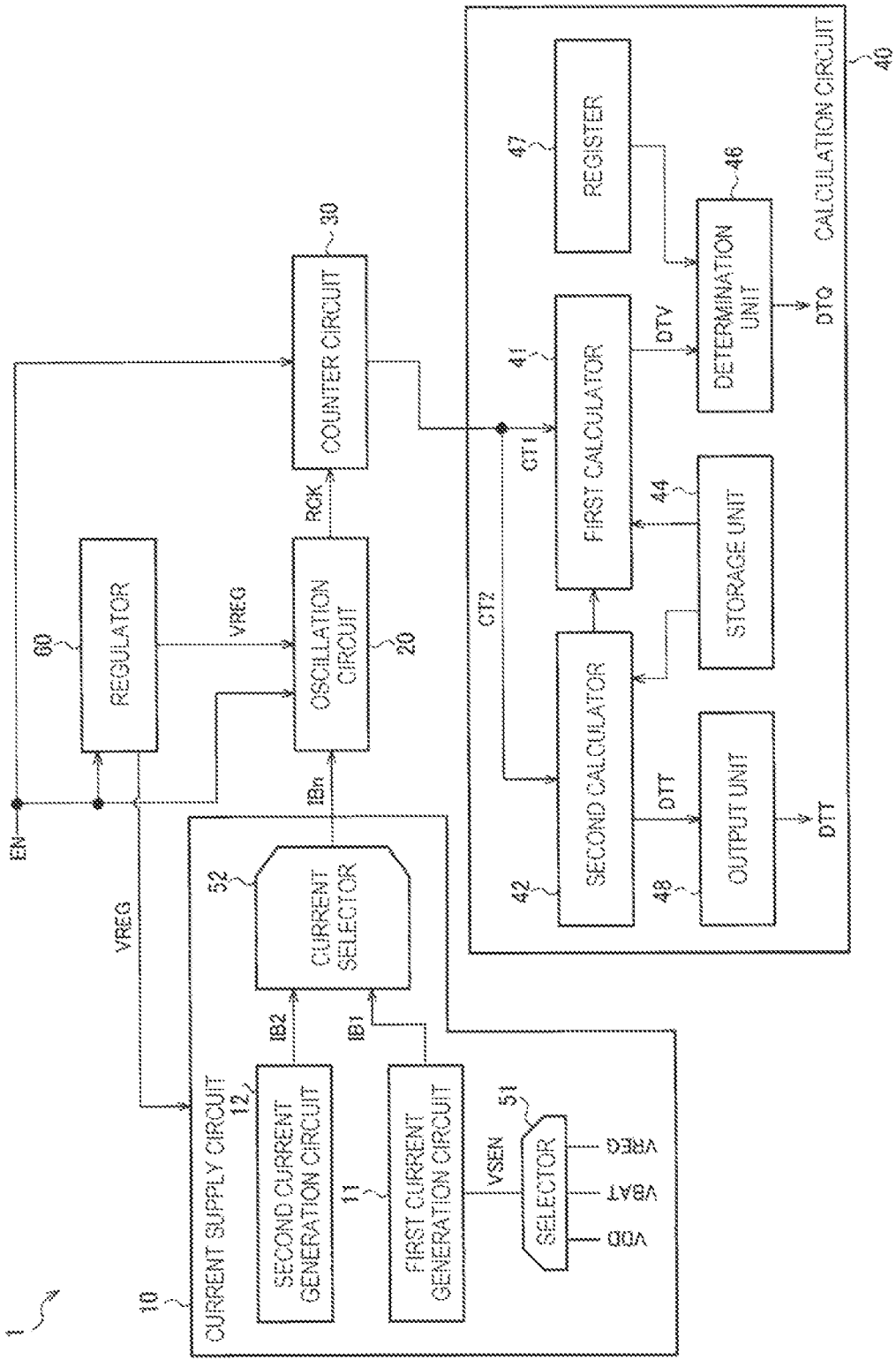
FIG. 2 shows a detailed configuration example of the circuit device according to the embodiment.

FIG. 2 shows a detailed configuration example according to the embodiment. In the detailed configuration example shown in FIG. 2, the current supply circuit 10 includes a first current generation circuit 11, a second current generation circuit 12, a selector 51, and a current selector 52. The calculation circuit 40 includes a first calculator 41, a second calculator 42, a storage unit 44, a determination unit 46, a register 47, and an output unit 48. The circuit device 1 is also provided with a regulator 60.

Figure 3:
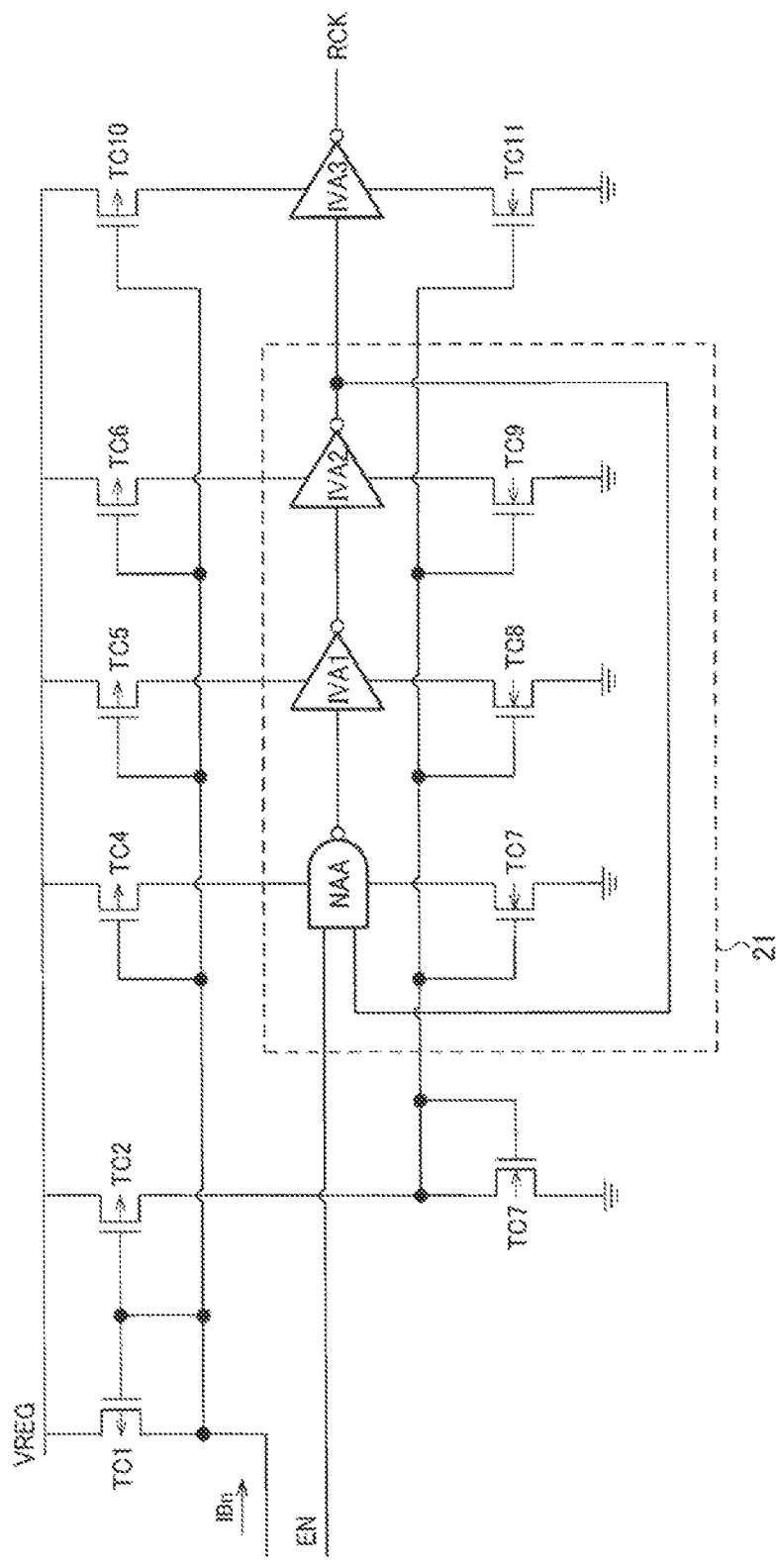
FIG. 3 is an example of a circuit diagram of an oscillation circuit in the circuit device according to the embodiment.

FIG. 3 is a configuration example of the oscillation circuit 20. The oscillation circuit 20 is implemented by the ring oscillator, and operates using a voltage VREG, which is a regulated voltage from the regulator 60, as a power supply voltage. The oscillation circuit 20 includes a NAND circuit NAA, inverter circuits IVA1 and IVA2, which are coupled in a loop shape, and an inverter circuit IVA3 as a buffer circuit. By coupling the circuits NAA, IVA1, IVA2, which are the odd number of signal inverting circuits, in the loop shape, the clock signal RCK, which is the oscillation clock signal, can be generated as the output signal. An enable signal EN for enabling or disenabling the operation of the ring oscillator is input to the NAND circuit NAA. By controlling the enable signal EN to be activated or deactivated, the operation of the ring oscillator can be controlled. P-type transistors TC4, TC5, and TC6 through which an operating current passes are provided on a VREG side of the NAND circuit NAA and the inverter circuits IVA1 and IVA2, and N-type transistors TA7, TA8, and TA9 are provided on a GND side. A P-side bias voltage corresponding to the supply current IBn output from the current supply circuit 10 is input to gates of the transistors TC4, TC5, and TC6, and an N-side bias voltage is input to gates of the transistors TC7, TC8, and TC9. Accordingly, the operating current flowing through each signal inverting circuit of the oscillation circuit 20 is controlled, and a sine wave oscillation signal having a frequency corresponding to the supply current IBn is generated. The inverter circuit IVA3 buffers the sine wave oscillation signal output from the inverter circuit IVA2 of a loop 21 of the oscillation circuit 20, and outputs the rectangular wave clock signal RCK. As described above, the oscillation circuit 20 outputs the clock signal RCK whose frequency changes based on the supply current IBn. As shown in FIG. 3, when the oscillation circuit 20 includes the loop 21 having the signal inverting circuits in three stages, and input capacitances of the NAND circuit NAA and the inverter circuits IVA1 and IVA2 are CIN, a frequency FOUT of the clock signal RCK of the oscillation circuit 20 is $\{IBn/(CIN \times VREG)\}/3$.

The regulator 60 regulates a power supply voltage VDD, which is an external power supply voltage, and supplies the regulated voltage VREG as the power supply voltage of the oscillation circuit 20. The power supply voltage VDD is, for example, a voltage of 1.5 V to 3.6 V.

Figure 18:
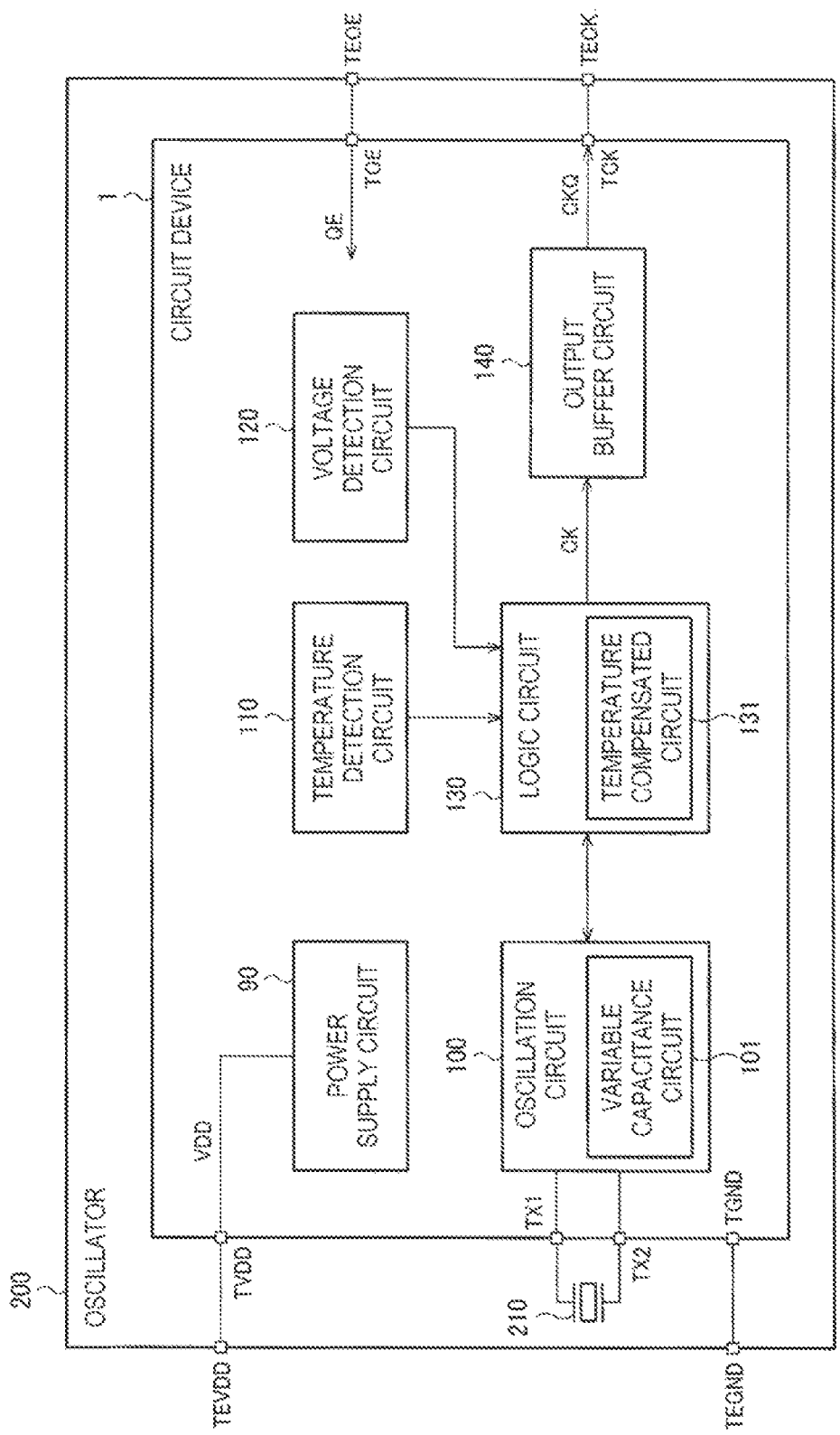
FIG. 18 is a configuration example of an oscillator according to the embodiment.

As shown in FIG. 4, the counter circuit 30 counts the clock signal RCK output from the oscillation circuit 20 in a count period TSENS defined by a clock signal OSC, and outputs a count value as temperature data. The count period TSENS is the above-described given period in which the count process is performed. The counter circuit 30 performs the count process on the number of pulses of the clock signal RCK output from the oscillation circuit 20 using the clock signal OSC output from an oscillation circuit 100 of a resonator 210 described in FIG. 18. For example, a signal waveform shown in an upper part of FIG. 4 indicates a signal waveform of the clock signal RCK output from the oscillation circuit 20. A signal waveform of the clock signal OSC output from the oscillation circuit 100 of FIG. 18 is shown in a lower part of FIG. 4. For example, as shown in FIG. 4, the counter circuit 30 outputs the first count value CT1 obtained by counting the number of pulses of the clock signal RCK in the count period TSENS defined by the clock signal OSC output from the oscillation circuit 100.

Figure 5:
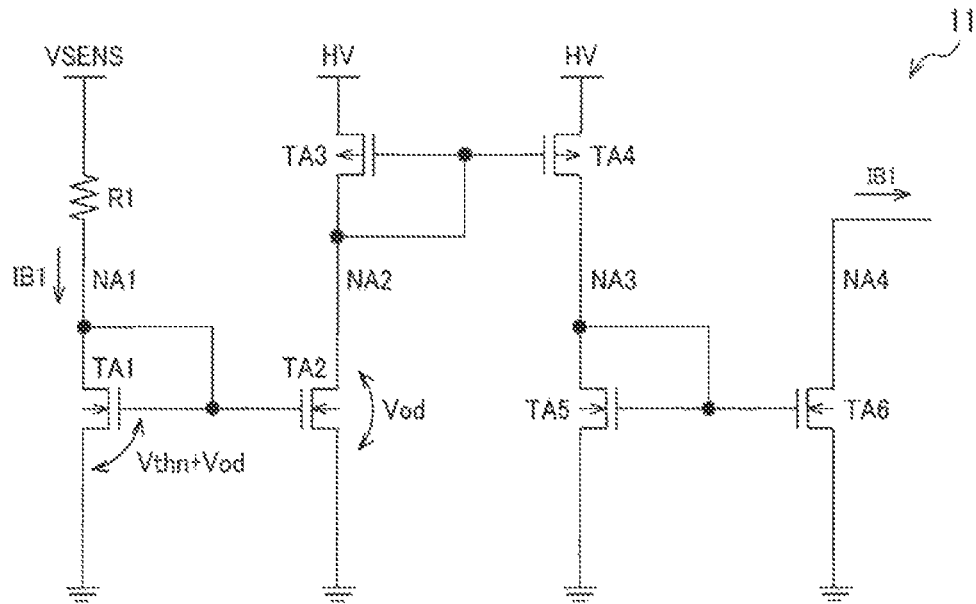
FIG. 5 is an example of a circuit diagram of a first current generation circuit.

As described above, in the detailed configuration example shown in FIG. 2, the current supply circuit 10 includes the first current generation circuit 11 and the second current generation circuit 12. FIG. 5 shows a configuration example of the first current generation circuit 11.

As shown in FIG. 5, the first current generation circuit 11 includes transistors TA1, TA2, TA3, TA4, TA5, and TA6, and a resistor R1. The transistors TA1, TA2, TA5, and TA6 are the N-type transistors, and the transistors TA3 and TA4 are the P-type transistors. One end of the resistor R1 is supplied with the detection target voltage VSEN, and the other end thereof is coupled to a drain of the transistor TA1. The transistor TA1 is a diode-coupled transistor whose drain and gate are coupled. A gate of the transistor TA2 is coupled to the gate of the transistor TA1. The transistor TA3 and the transistor TA4 constitute a current mirror circuit, a current flowing through the transistor TA2 flows through the transistor TA3, and this current is mirrored by the transistor TA4. The transistor TA5 and the transistor TA6 constitute a current mirror circuit, a current flowing through the transistor TA4 flows through the transistor TA5, and this current is mirrored by the transistor TA6. Accordingly, the first current IB1 is supplied as the supply current IBn from the first current generation circuit 11 to the oscillation circuit 20.

For example, when a gate-source voltage of the diode-coupled transistor TA1 is Vthn+Vod, a voltage of a node NA1, which is a coupling node between the resistor R1 and the transistor TA1, is Vthn+Vod. Here, Vthn is a threshold voltage of the N-type transistor. Accordingly, VSEN−(Vthn+Vod) is applied to both ends of the resistor R1, the current of IB1={VSEN−(Vthn+Vod)}/R1 flows through the resistor R1, and the first current IB1 is supplied to the oscillation circuit 20. Accordingly, the first current IB1={VSEN−(Vthn+Vod)}/R1 that changes according to the detection target voltage VSEN is supplied to the oscillation circuit 20 as the supply current IBn.

Figure 6:
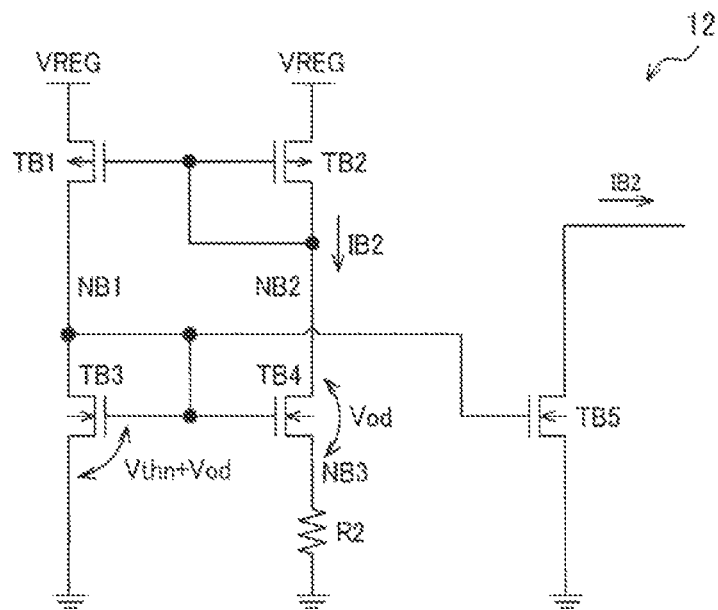
FIG. 6 is an example of a circuit diagram of a second current generation circuit.

FIG. 6 shows a configuration example of the second current generation circuit 12. As shown in FIG. 6, the second current generation circuit 12 includes transistors TB1, TB2, TB3, TB4, and TB5, and a resistor R2. TB1 and TB2 are the P-type transistors, and TB3, TB4, and TB5 are the N-type transistors. The transistor TB1 and the transistor TB2 constitute a current mirror circuit. The transistor TB3 is a diode-coupled transistor whose drain and gate are coupled, a drain of the transistor TB3 is coupled to a drain of the transistor TB1. A drain of the transistor TB4 is coupled to a drain of the transistor TB2, a gate of the transistor TB4 is coupled to the gate of the transistor TB3, and a source of the transistor TB4 is coupled to one end of the resistor R2. The other end of the resistor R2 is coupled to a GND node. The GND node is a ground node and a low potential side power supply node. For example, a size W/L of the transistor TB4 is set to be larger than a size W/L of the transistor TB3. The transistor TB3 and the transistor TB5 constitute a current mirror circuit, and a second current IB2 flowing through the transistor TB5 is supplied as the supply current IBn from the second current generation circuit 12 to the oscillation circuit 20.

When a gate-source voltage of the diode-coupled transistor TB3 is Vthn+Vod, a drain-source voltage of the transistor TB4 is Vod, and a voltage of a node NB3, which is a source node of the transistor TB4, is Vthn. Vthn is the threshold voltage of the N-type transistor. Accordingly, a current of IB2=Vthn/R2 flows through the resistor R2, and the second current IB2 flows through the transistor TB5. Vthn, which is the threshold voltage, has, for example, a negative temperature characteristic, and is a temperature-dependent voltage that changes according to a temperature. Accordingly, the second current IB2=Vthn/R2 that changes according to the temperature can be supplied to the oscillation circuit 20 as the supply current IBn.

Figure 7:
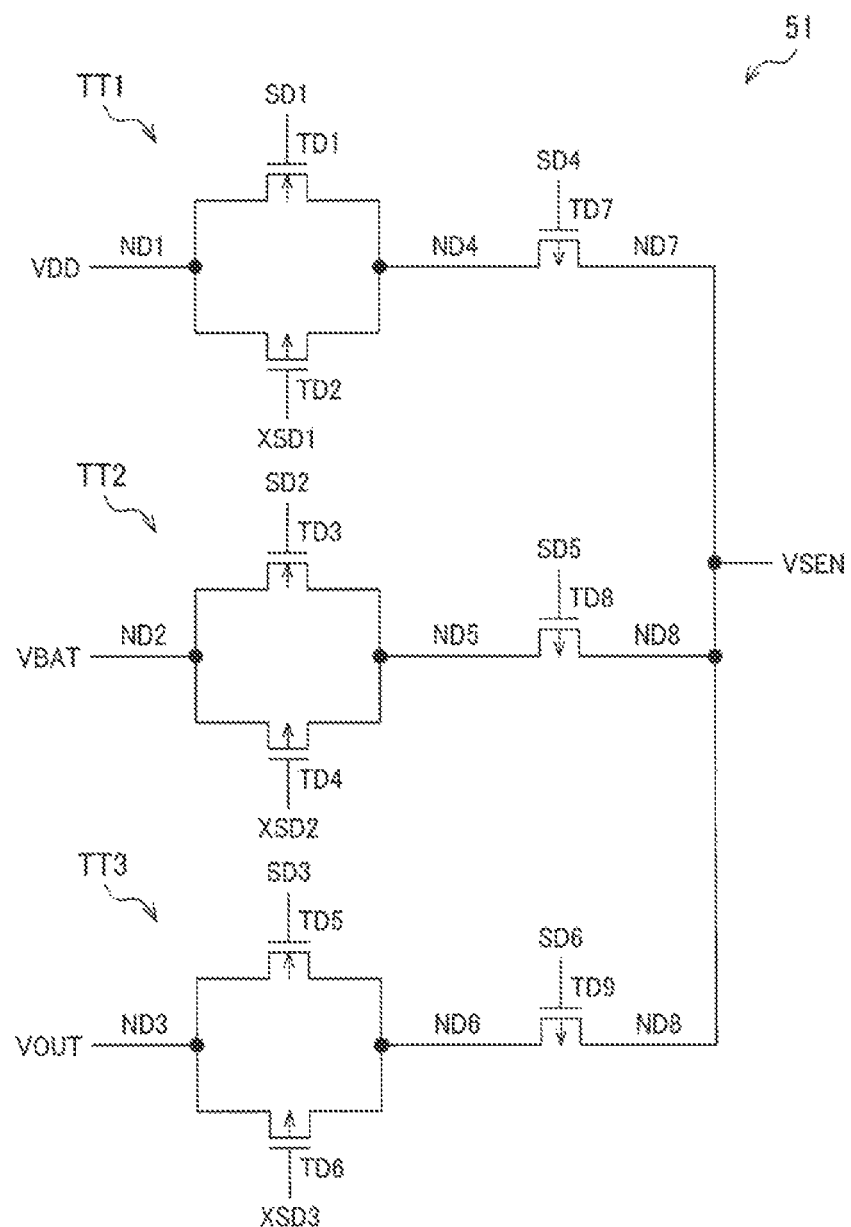
FIG. 7 is an example of a circuit diagram of a selector for a detection target voltage.

FIG. 7 shows a circuit configuration example of the selector 51. The selector 51 includes transistors TD1 to TD9. The transistors TD1 and TD2 constitute a transfer gate TT1, the transistors TD3 and TD4 constitute a transfer gate TT2, and the transistors TD5 and TD6 constitute a transfer gate TT3. As shown in FIG. 7, input signals of the selector 51 are, for example, the power supply voltage VDD, a battery voltage VBAT, and an output voltage VOUT. For example, regarding the power supply voltage VDD, the power supply voltage VDD of a node ND1 is transmitted to a node ND4 by turning on the transfer gate TT1. When the transistor TD7 is turned on, a voltage of a node ND7 becomes the power supply voltage VDD, and the detection target voltage VSEN output from the selector 51 becomes the power supply voltage VDD. The same applies to a case where the input signal is the battery voltage VBAT or the output voltage VOUT.

For example, when the input signal is the battery voltage VBAT, the transfer gate TT2 and the transistor TD8 are respectively turned on, so that the battery voltage VBAT of a node ND2 is transferred to a node ND8 and output as an output signal. As described above, by turning on the transfer gate or the transistor corresponding to a voltage to be selected, the voltage of the detection target voltage VSEN output from the selector 51 is determined. The on and off of the transistors in FIG. 7 are controlled by switch control signals SD1 to SD6.

Figure 8:
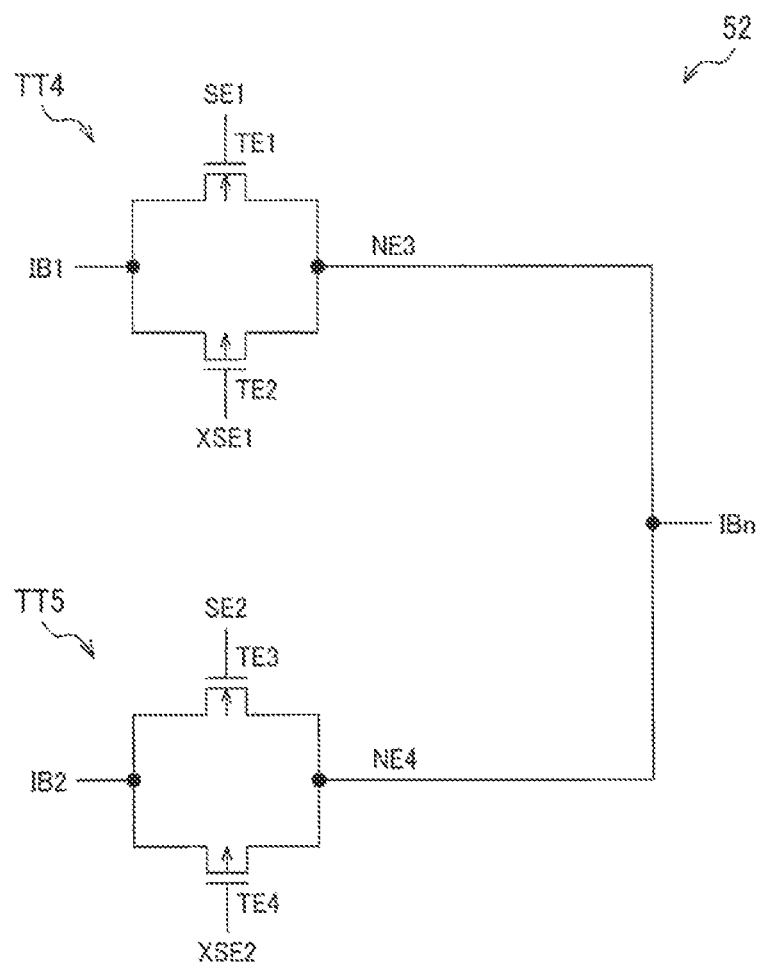
FIG. 8 is an example of a circuit diagram of a selector for a supply current.

FIG. 8 shows a circuit configuration example of the current selector 52. The current selector 52 selects one of the first current IB1 and the second current IB2 output from the current supply circuit 10, and outputs the selected current as the supply current IBn. The current selector 52 includes transistors TE1 to TE4, the transistors TE1 and TE2 constitute a transfer gate TT4, and the transistors TE3 and TE4 constitute a transfer gate TT5. In the current selector 52, the first current IB1 output from the current supply circuit 10 is input to the transfer gate TT4, and the second current IB2 is input to the transfer gate TT5. Then, similarly to the description of the selector 51 shown in FIG. 6, one of the first current IB1 and the second current IB2 is selected and output as the supply current IBn by turning on one of the transfer gates TT4 and TT5. The on and off of the transistors in FIG. 8 are controlled by switch control signals SE1 and SE2.

As described above, in the embodiment, the current supply circuit 10 includes the first current generation circuit 11, the second current generation circuit 12, and the current selector 52. The first current generation circuit 11 generates the first current IB1 that changes according to the detection target voltage VSEN. Taking FIG. 5 as an example, for example, as IB1={VSEN−(Vthn+Vod)}/R1, the first current IB1 that changes according to a change in the detection target voltage VSEN is generated. The second current generation circuit 12 generates the second current IB2 that changes according to the temperature. Taking FIG. 6 as an example, when the threshold voltage Vthn has temperature dependence and changes according to the temperature, the second current IB2 that changes according to the change in the temperature is generated, for example, as IB2=Vthn/R2. The current selector 52 supplies the first current IV1 or the second current IB2 as the supply current IBn to the oscillation circuit 20. For example, when the circuit device 1 of FIG. 2 operates as a voltage detection circuit and detects the detection target voltage VSEN, the current selector 52 selects the first current IB1 from the first current generation circuit 11 and supplies the first current IB1 to the oscillation circuit 20. Then, the counter circuit 30 performs the process of counting the clock signal RCK, which is the output signal of the oscillation circuit 20, in the given period to obtain the first count value CT1, and the calculation circuit 40 calculates the detection voltage data of the detection target voltage VSEN based on the first count value CT1. When the circuit device 1 operates as a temperature detection circuit and detects the temperature, the current selector 52 selects the second current IB2 from the second current generation circuit 12 and supplies the second current IB2 to the oscillation circuit 20. Then, the counter circuit 30 performs the process of counting the clock signal RCK of the oscillation circuit 20 in the given period to obtain the second count value CT2, and the calculation circuit 40 calculates temperature data DTT corresponding to the temperature based on the second count value CT2. In this manner, when the detection target voltage VSEN is detected, the current selector 52 selects the first current IB1 to obtain the detection voltage data DTV corresponding to the detection target voltage VSEN, and when the temperature is detected, the current selector 52 selects the second current IB2 to obtain the temperature data DTT corresponding to the temperature. Therefore, the circuit device 1 can be operated as both the voltage detection circuit and the temperature detection circuit only by the current selector 52 switching the selection of the currents.

For example, in a normal circuit device, the voltage detection circuit and the temperature detection circuit are separately provided. For example, the voltage detection circuit performs voltage detection by comparing a detection target voltage with a band gap reference (BGR) voltage as a reference voltage by the comparator. The temperature detection circuit compares, for example, a detection voltage VF from the temperature sensor with a voltage VDAC obtained by a DAC circuit dividing the BGR voltage, by the comparator. The detection voltage VF is generated, for example, by driving a diode at a constant current in the temperature sensor. The temperature is detected by a circuit configuration in which a logic circuit controls a DAC adjustment code of the DAC circuit based on the output of the comparator and holds the DAC adjustment code in the register. As described above, in the normal circuit device, since the voltage detection circuit and the temperature detection circuit having different topology are separately provided, a circuit scale increases. In addition, detection accuracy of the voltage detection circuit is further restricted by accuracy of the BGR voltage and decomposition capability when the divided voltage VDAC is generated. The detection voltage range is also limited to a voltage set by hardware.

In this regard, according to the embodiment, the voltage detection or the temperature detection can be performed by inputting the first current IB1 corresponding to the detection target voltage VSEN or the second current IB2 corresponding to the temperature to the common oscillation circuit 20 and counting the number of clocks of the clock signal RCK output from the oscillation circuit 20. Accordingly, since it is not necessary to separately provide a voltage detection circuit and a temperature detection circuit having different topology, the increase in circuit scale can be prevented. Further, the detection accuracy of the voltage can be freely adjusted by changing a count time or a detection algorithm. A reference detection level at the time of detection can be freely selected by changing a stored value of the register. In this manner, the detection accuracy fixed to the hardware can be set by software. Further, according to the embodiment, it is possible to prevent the voltage detection accuracy from being restricted by the performance such as the decomposition capability of the analog circuit, and it is also possible to widen the detection voltage range. For example, in the voltage detection circuit in the related art, the detection voltage range is limited to the range of 3.0 V to 3.2 V, but according to the temperature detection circuit using the oscillation circuit 20 such as the ring oscillator as in the embodiment, the voltage can be detected in a range of 2.0 V to 3.5 V, and usable batteries and the like can be increased. Further, since a variation caused by an individual difference due to a temperature detection result can be reduced, the detection accuracy of the voltage detection circuit can also be improved.

As shown in FIG. 2, the current supply circuit 10 includes the selector 51 that selects and outputs the detection target voltage VSEN from a plurality of voltages including a first power supply voltage and a second power supply voltage. For example, the selector 51 outputs a voltage selected from the plurality of voltages as the detection target voltage VSEN to the first current generation circuit 11. For example, in FIG. 2, the first power supply voltage is one of VDD, VBAT, and VREG, and the second power supply voltage is the other one of VDD, VBAT, and VREG. In this manner, a voltage to be detected from the plurality of voltages can be selected by the selector 51 as the detection target voltage VSEN. The current supply circuit 10 supplies, to the oscillation circuit 20, the first current IB1 that changes according to the selected detection target voltage VSEN, so that the detection voltage data DTV corresponding to the selected detection target voltage VSEN can be obtained.

The oscillation circuit 20 is, for example, the ring oscillator as shown in FIG. 3. In this manner, the oscillation frequency of the ring oscillator is controlled by the supply current IBn from the current supply circuit 10, so that the count value corresponding to the supply current IBn is output from the counter circuit 30, and the detection voltage data DTV and the like can be obtained.

Next, the calculation circuit 40 will be described in detail. As described above, the calculation circuit 40 includes the first calculator 41, the second calculator 42, the storage unit 44, the determination unit 46, the register 47, and the output unit 48. The calculation circuit 40 performs the temperature calculation process of calculating the temperature data DTT based on the second count value CT2 obtained in the count process in a state in which the second current IB2 is supplied to the oscillation circuit 20. This temperature calculation process is performed by the second calculator 42. The count process in which the second current IB2 is supplied to the oscillation circuit 20 is a count process in a state in which the current selector 52 selects and supplies the second current IB2 to the oscillation circuit 20. In this manner, the counter circuit 30 can output the second count value CT2 that changes according to the temperature to the calculation circuit 40, and the calculation circuit 40 can perform the temperature calculation process based on the second count value CT2 that changes according to the temperature to calculate the temperature data DTT corresponding to the temperature. Accordingly, it is possible to obtain the temperature data DTT by operating the circuit device 1 as the temperature detection circuit. The temperature data DTT obtained as described above is output to the outside by the output unit 48.

The calculation circuit 40 performs a correction process based on the temperature data DTT in the voltage calculation process to obtain the detection voltage data DTV. This correction process is performed by the first calculator 41. For example, the calculation circuit 40 performs the temperature calculation process of obtaining the temperature data DTT based on the second count value CT2 output from the counter circuit 30 when the current selector 52 selects the second current IB2. This temperature calculation process is performed by the second calculator 42. Then, the calculation circuit 40 performs the correction process based on the temperature data DTT obtained as described above in the voltage calculation process to obtain the detection voltage data DTV. In this manner, the calculation circuit 40 can effectively use the temperature data DTT obtained based on the second count value CT2 to perform the correction process on the detection voltage data DTV.

In FIG. 2, the register 47 stores reference voltage data DRF, and the determination unit 46 compares the reference voltage data DRF with the detection voltage data DTV calculated by the first calculator 41 and outputs a determination result DTQ. In this manner, the calculation circuit 40 compares the reference voltage data DRF corresponding to the reference voltage with the detection voltage data DTV to determine whether the detection target voltage VSEN is the reference voltage. In this manner, whether the detection target voltage VSEN exceeds or falls below the reference voltage corresponding to the reference voltage data DRF can be output as the determination result DTQ. Accordingly, for example, whether VDD, VBAT, and VREG in FIG. 2 exceed or fall below the reference voltage, which is a threshold voltage for detection, can be detected.

The calculation circuit 40 corrects a temperature variation of the detection voltage data DTV with respect to the detection target voltage VSEN in the voltage calculation process based on the temperature data DTT. For example, the first current IB1 output from the first current generation circuit 11 described with reference to FIG. 5 or the like has the temperature variation and changes according to the temperature. When the correction process, which is a temperature compensation process for the detection voltage data DTV, is performed using the temperature data DTT obtained based on the second count value CT2, the detection voltage data DTV can be obtained without such a temperature variation. Accordingly, the calculation circuit 40 can effectively use the temperature data DTT obtained based on the second count value CT2 to implement the correction process of compensating for the temperature variation of the detection voltage data DTV.

The storage unit 44 of FIG. 2 stores a temperature correction coefficient for correcting the temperature variation. The correction coefficient corresponds to a correction coefficient obtained in step S1 of FIG. 10 to be described later. The calculation circuit 40 corrects the detection voltage data DTV based on the temperature correction coefficient stored in the storage unit 44. In this manner, the temperature correction coefficient for correcting the temperature variation is stored in the storage unit 44, and the temperature variation of the detection voltage data DTV can be corrected using the stored temperature correction coefficient. For example, by writing the temperature correction coefficient in the storage unit 44 at the time of manufacturing or inspecting the circuit device 1, the temperature variation of the detection voltage data DTV can be appropriately corrected.

The storage unit 44 can be implemented by a semiconductor memory such as a nonvolatile memory. The nonvolatile memory is a memory that stores information even without power supply. For example, the nonvolatile memory is a memory that can store information without power supply and in which information can be rewritten. The nonvolatile memory can be implemented by an electrically erasable programmable read-only memory (EEPROM) or the like that is implemented by a floating gate avalanche injection MOS memory (FAMOS memory) or a metal-oxide-nitride-oxide-silicon memory (MONOS memory).

The calculation circuit 40 corrects an individual variation of the temperature data DTT with respect to the temperature in the temperature calculation process. The correction of the individual variation of the temperature data DTT is performed by, for example, the second calculator 42. For example, when the current supply circuit 10 supplies the second current IB2 corresponding to the temperature to the oscillation circuit 20, and the temperature data DTT is obtained based on the second count value CT2 output by the counter circuit 30, individual variations different for each device occur in the temperature data DTT. In this case, when the calculation circuit 40 corrects the individual variation of the temperature data DTT, it is possible to obtain the temperature data DTT as an absolute temperature from which the individual variation is eliminated.

The storage unit 44 stores an individual variation correction coefficient for correcting the individual variation. The correction coefficient corresponds to a correction coefficient obtained in step S1 of FIG. 10 to be described later. The calculation circuit 40 corrects the temperature data DTT based on the temperature correction coefficient stored in the storage unit 44. In this manner, the temperature correction coefficient for correcting the individual variation is stored in the storage unit 44, and the individual variation of the temperature data DTT can be corrected using the stored temperature correction coefficient. For example, by writing the temperature correction coefficient in the storage unit 44 at the time of manufacturing or inspecting the circuit device 1, the individual variation of the temperature data DTT for each device can be appropriately corrected.

Figure 9:
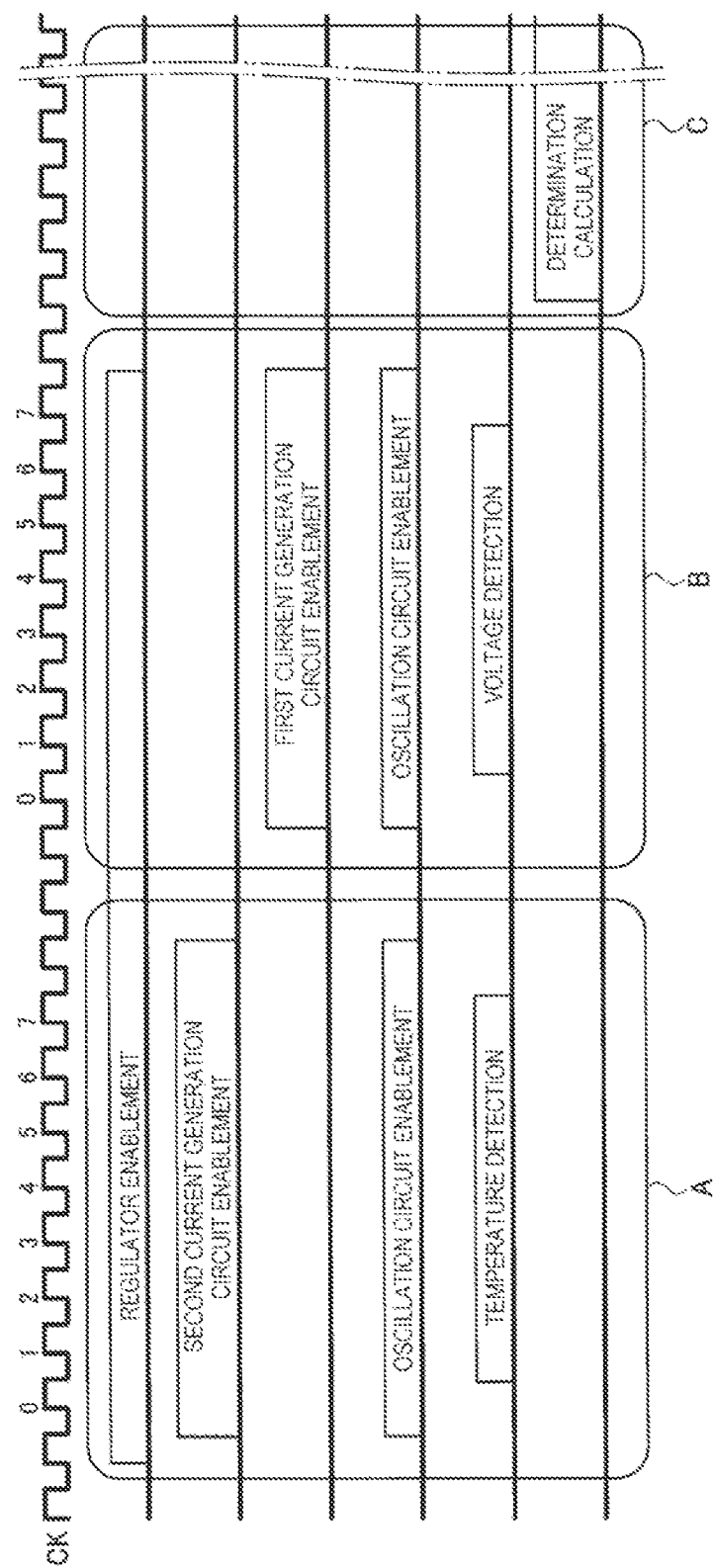
FIG. 9 is a signal waveform diagram showing an outline of an operation of the detailed configuration example according to the embodiment.

FIG. 9 is a signal waveform diagram showing an outline of an operation of the detailed configuration example shown in FIG. 2. An upper part of FIG. 9 shows a waveform of a clock signal CK to be described later with reference to FIG. 18. First, an operation of the regulator 60 is enabled, accordingly, the external power supply is regulated, and the stable regulated voltage VREG is supplied to the current supply circuit 10, the oscillation circuit 20, and the like as the power supply. After the operation of the regulator 60 is enabled, the operations of the second current generation circuit 12 and the oscillation circuit 20 are enabled, the second current IB2 corresponding to the temperature is supplied as the supply current IBn from the second current generation circuit 12 to the oscillation circuit 20, and the clock signal RCK having a frequency corresponding to the supply current IBn is generated in the oscillation circuit 20. During a period in which the second current generation circuit 12 and the oscillation circuit 20 are in an operation enable state, the temperature detection is performed by the circuit device 1, and a process of obtaining the temperature data DTT is executed. As described above, a part indicated by A in FIG. 9 corresponds to the operation related to the detection of the temperature data DTT.

Next, when the regulator 60 is in the operation enable state, the operations of the first current generation circuit 11 and the oscillation circuit 20 are enabled, the first current IB1 corresponding to the voltage is supplied as the supply current IBn from the first current generation circuit 11 to the oscillation circuit 20, and the clock signal RCK having a frequency corresponding to the supply current IBn is generated in the oscillation circuit 20. During a period in which the first current generation circuit 11 and the oscillation circuit 20 are in the operation enable state, the voltage detection is performed by the circuit device 1, and a process of obtaining the detection voltage data DTV is executed. As described above, a part indicated by B in FIG. 9 corresponds to the process related to the detection operation of the detection voltage data DTV.

After the temperature detection and the voltage detection are completed, determination calculation indicated by C is performed. In this determination calculation, for example, the detection voltage data DTV obtained in the voltage detection indicated by B is subjected to the correction process based on the temperature data DTT obtained in the temperature detection indicated by A, and the detection voltage data DTV from which the temperature variation and the individual variation are removed is obtained.

3. Correction Algorithm

Next, a correction algorithm used in the embodiment will be described. As described above, in the circuit device 1 according to the embodiment, when the temperature is detected, the circuit device 1 is influenced by the variation due to the individual difference of each device, and when the voltage is detected, the circuit device 1 is influenced by the variation due to the temperature in addition to the individual difference of each device. The correction algorithm according to the embodiment can be used as a method of correcting such variations and calculating an absolute temperature from which the influence of the individual difference is prevented or calculating an absolute voltage from which the variations due to the individual difference and the temperature are eliminated.

Figure 10:
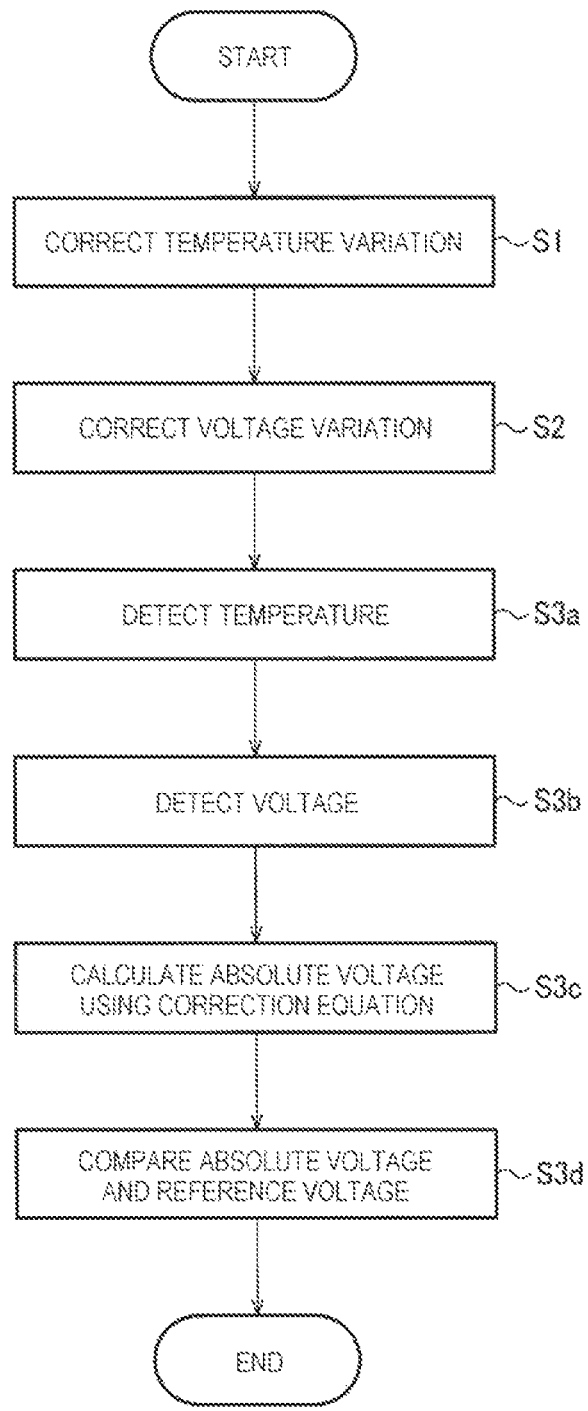
FIG. 10 is a flowchart showing a correction algorithm according to the embodiment.

FIG. 10 is a flowchart showing the correction algorithm according to the embodiment. As an outline of the correction algorithm according to the embodiment, first, a temperature variation is corrected in step S1. Specifically, in step S1, a correction equation for conversion into an absolute temperature independent of an individual is calculated. Next, a voltage variation is corrected in step S2. Specifically, in step S2, a correction equation for conversion into an absolute voltage independent of a temperature is calculated. Here, steps S1 and S2 are performed, for example, in an inspection step. Then, in processes from step S3a to step S3d, the absolute voltage is calculated using the correction equations in steps S1 and S2, and the absolute voltage and the reference voltage are compared. The processes from step S3a to step S3d can be performed within the IC.

As described above, even when the individual devices on which the circuit device 1 is mounted have a same detection target temperature, a variation occurs in the temperature detected for each device. In step S1, the variation due to the individual difference for each device is corrected, and the absolute temperature independent of the individual difference is obtained.

Figure 11:
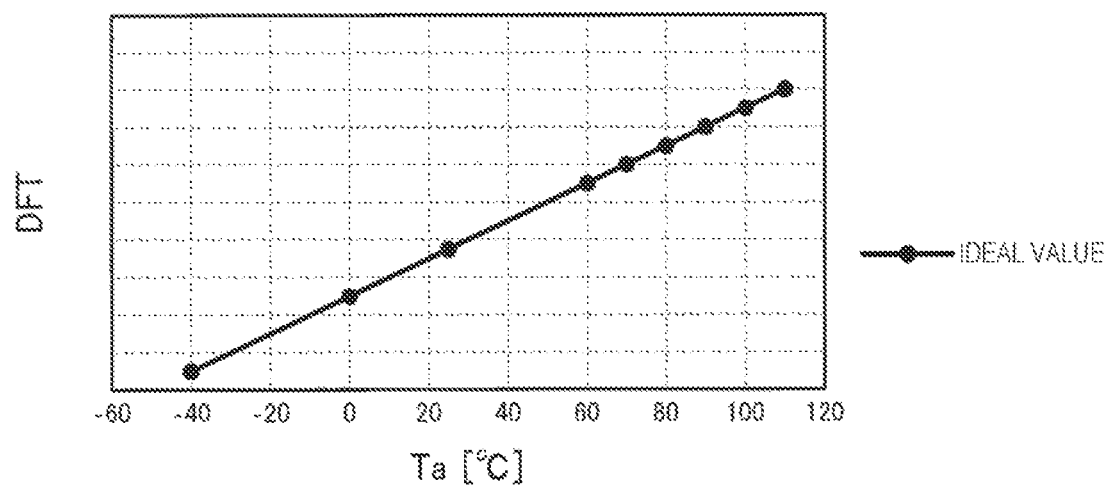
FIG. 11 is a diagram showing an example of an ideal relationship between the detection target voltage and a temperature sensor output frequency.
Figure 12:
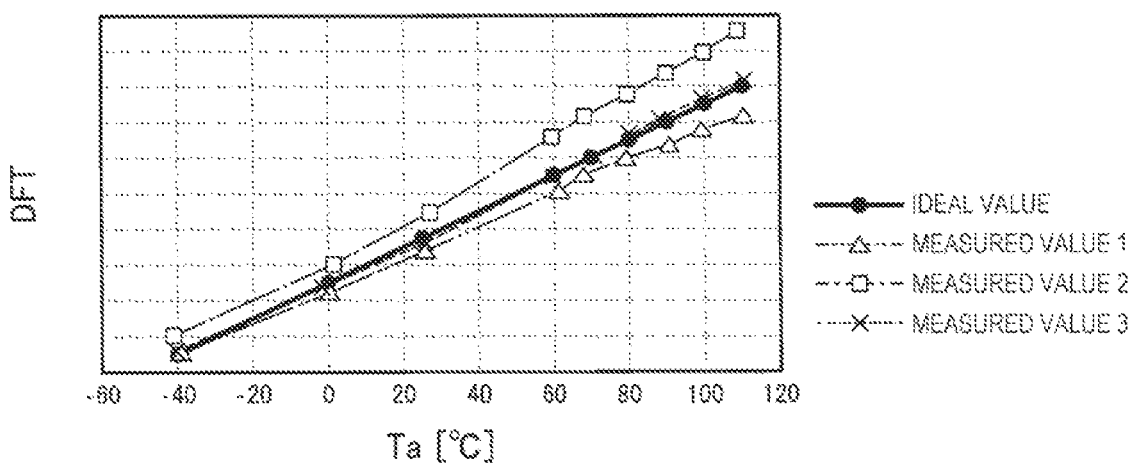
FIG. 12 is a diagram comparing measurement data of the temperature sensor output frequency with an ideal value.

Specifically, first, an ideal relationship between a detection target temperature Ta and a temperature sensor output frequency is defined. Here, the temperature sensor output frequency is a count value obtained by counting the number of clocks of the clock signal RCK of the oscillation circuit 20 for the predetermined count period TSENS at the certain detection target temperature Ta, and is referred to as DFT. DFT is the second count value CT2 described in FIG. 2 and the like. Assuming that ideal values of the detection target temperature Ta and DFT are Tideal and DFTideal, respectively, an ideal correspondence relationship between the detection target temperature Ta and DFT can be represented as DFTideal=a×Tideal+b, where a is a slope of an ideal straight line that becomes a target value after correction, and b is an intercept. Here, a of the slope of the ideal straight line is a target slope value, and b of the intercept of the ideal straight line is a target intercept. DFTideal, which is corrected DFT, is referred to as a corrected count value. FIG. 11 is an example in which the ideal straight line is plotted on a graph in which a horizontal axis represents the detection target temperature Ta and a vertical axis represents DFT, that is, the temperature sensor output frequency. In the example shown in FIG. 11, the ideal straight line is a straight line having a positive slope a and rising to the right. The ideal straight line is a target value and can be freely determined, and a plurality of samples may be actually determined. In step S1, two or more sets of the detection target temperature Ta and DFT, which is the temperature sensor output frequency, are measured by the inspection. Here, a temperature of a thermostatic oven or the like may be used as the detection target temperature Ta. When the measurement is performed for a certain sample m at n different points of temperature, measured values (Tm1, DFTm1), (Tm2, DFTm2), . . . , and (Tmn, DFTmn) are obtained. Then, a relational expression between the temperature in the sample m and DFT can be obtained from the n sets of measured values. The relational expression between the temperature in the sample m and DFT can be represented as DFTmn=A×Tmn+B, for example. Here, A of the slope value and B of the intercept are different values for the samples, and for example, A can be obtained by (DFTm2−DFTm1)/(Tm2−Tm1), and B can be obtained by DFTm1−A×Tm1. FIG. 12 is a diagram in which the detection target temperature Ta, the ideal straight line of DFT, and straight lines obtained from actual measurement are plotted in an overlapping manner and compared. FIG. 12 shows an example in which the detection target temperature Ta and DFT are measured for three samples, and measurement data thereof is plotted on a graph as measured values 1, 2, and 3. The measured value 1 is indicated by a triangular mark, and an approximate straight line is also displayed thereon. The measured value 2 is indicated by a square mark, the measured value 3 is indicated by a × mark, and similarly, the approximate straight line is also displayed. As shown in FIG. 12, dependency of DFT and the detection target temperature Ta in each sample is substantially common in the straight line rising to the right, but there is a deviation for each sample. Then, a of the target slope value of the ideal straight line, b of the target intercept, and A and B of each sample are written to the memory. Then, an absolute temperature Tcalc obtained by correcting the individual variation can be obtained from these pieces of data. First, assuming that the slope of the approximate straight line for the sample m is A and the intercept is B, DFTcalc, which is the temperature sensor output frequency after the correction to the ideal straight line, and the absolute temperature Tcalc are respectively expressed by Equations (1) and (2). In this manner, the temperature obtained for each sample can be corrected to the absolute temperature Tcalc independent of the sample.

$$DFTcalc = \frac{a}{A}(DFTmn(Tmn) - B) + b \quad (1)$$

$$Tcalc = \frac{DFTcalc - b}{a} \quad (2)$$

Figure 13:
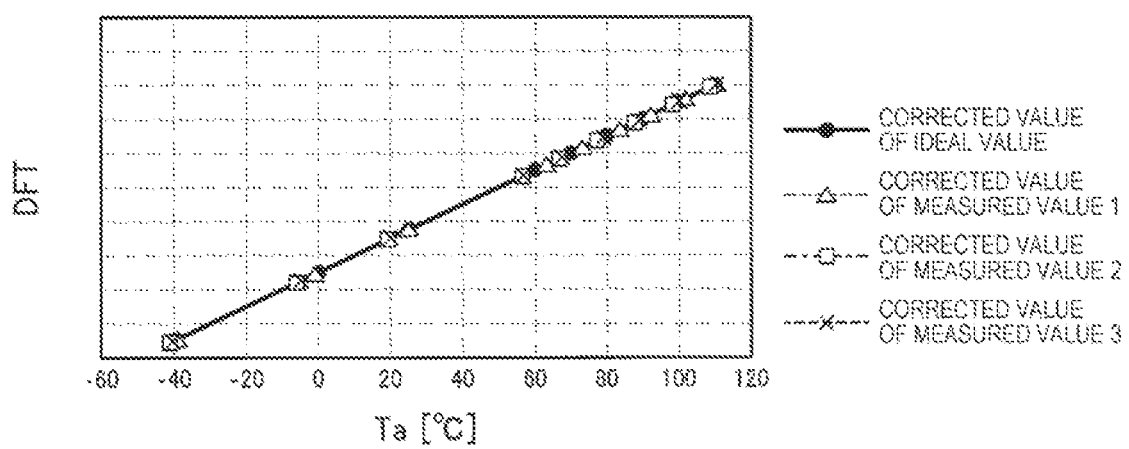
FIG. 13 is a diagram showing a corrected temperature sensor output frequency and an ideal straight line.

FIG. 13 is an example in which such correction is performed for each sample, and each corrected straight line and an ideal straight line are superimposed and plotted on a graph. As shown in FIG. 13, the corrected straight line of each sample overlaps with the ideal straight line, and there is no variation in the temperature dependence of each sample.

Next, step S2 will be described. In step S2, the voltage variation is corrected to calculate a correction equation for conversion into the absolute voltage. First, nine or more sets of the detection target temperature Ta, the detection target voltage VSEN, and the voltage sensor output frequency are measured. Here, the voltage sensor output frequency is a count value obtained by counting the number of clocks of the clock signal RCK of the oscillation circuit 20 for the predetermined count period TSENS, and is referred to as DFV. DFV is the first count value CT1 described in FIGS. 1, 2, and the like. For example, when the sample m is measured at temperatures Tm1, Tm2, Tm3, . . . , and Tmn, at the temperature Tm1, (Vm11, DFVm11), (Vm12, DFVm12), (Vm13, DFVm13) are obtained. Here, for example, DFVm11 indicates DFV at the temperature Tm1 of the sample m. At the temperature Tm2, (Vm21, DFVm21), (Vm22, DFVm22), (Vm23, DFVm23) are obtained, at the temperature Tm3, (Vm31, DFVm31), (Vm32, DFVm32), (Vm33, DFVm33) are obtained, and at the temperature Tmn, (Vmn1, DFVmn1), (Vmn2, DFVmn2), (Vmn3, DFVmn3) are obtained. In step S2, when the detection target voltage VSEN and DFVm are measured for the sample m as described above, the absolute temperature Tcalc obtained by correcting the individual variation obtained in step S1 can be used.

Figure 14:
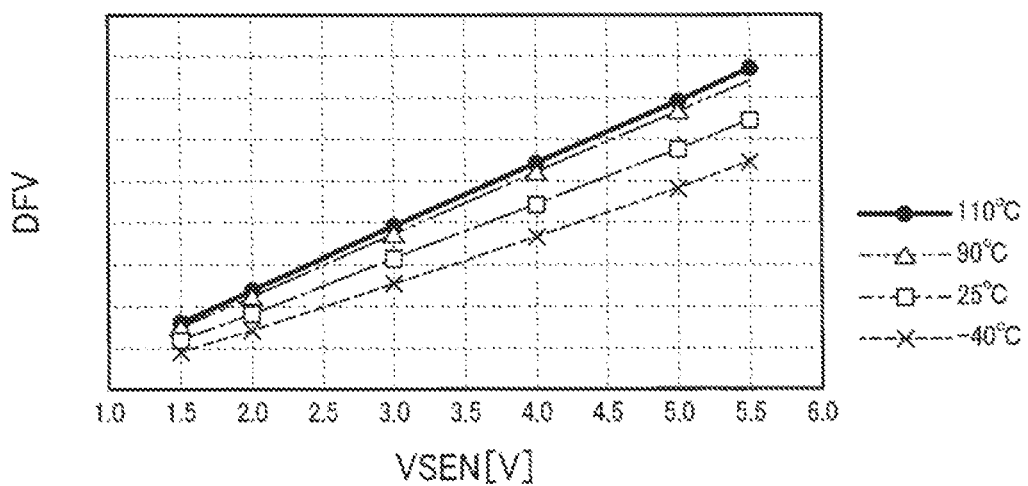
FIG. 14 is a diagram showing an example of measurement data of the detection target voltage and a voltage sensor output frequency at each temperature.

Then, the measurement results are plotted on a graph, and an approximate line of the voltage dependence of DFVm for the sample m is calculated for each temperature. FIG. 14 shows an example of plotting measurement data of DFVm and voltage at each temperature. FIG. 14 is an example of plotting measurement data at four temperatures from −40° C. to 110° C., and the slope of the straight line increases as the temperature increases. For each of the temperatures Tm1, Tm2, Tm3, and Tm4, the relational expression between DFVm and the voltage Vm can be represented as Equations (3) to (6).

$$DFVm1 \times (Tm1) = \alpha(Tm1) \cdot Vm1 \times + \beta(Tm1) \quad (3)$$

$$DFVm2 \times (Tm2) = \alpha(Tm2) \cdot Vm2 \times + \beta(Tm2) \quad (4)$$

$$DFVm3 \times (Tm3) = \alpha(Tm3) \cdot Vm3 \times + \beta(Tm3) \quad (5)$$

$$DFVm4(Tm4) = \alpha(Tm4) \cdot Vm4 \times + \beta(Tm4) \quad (6)$$

Figure 15:
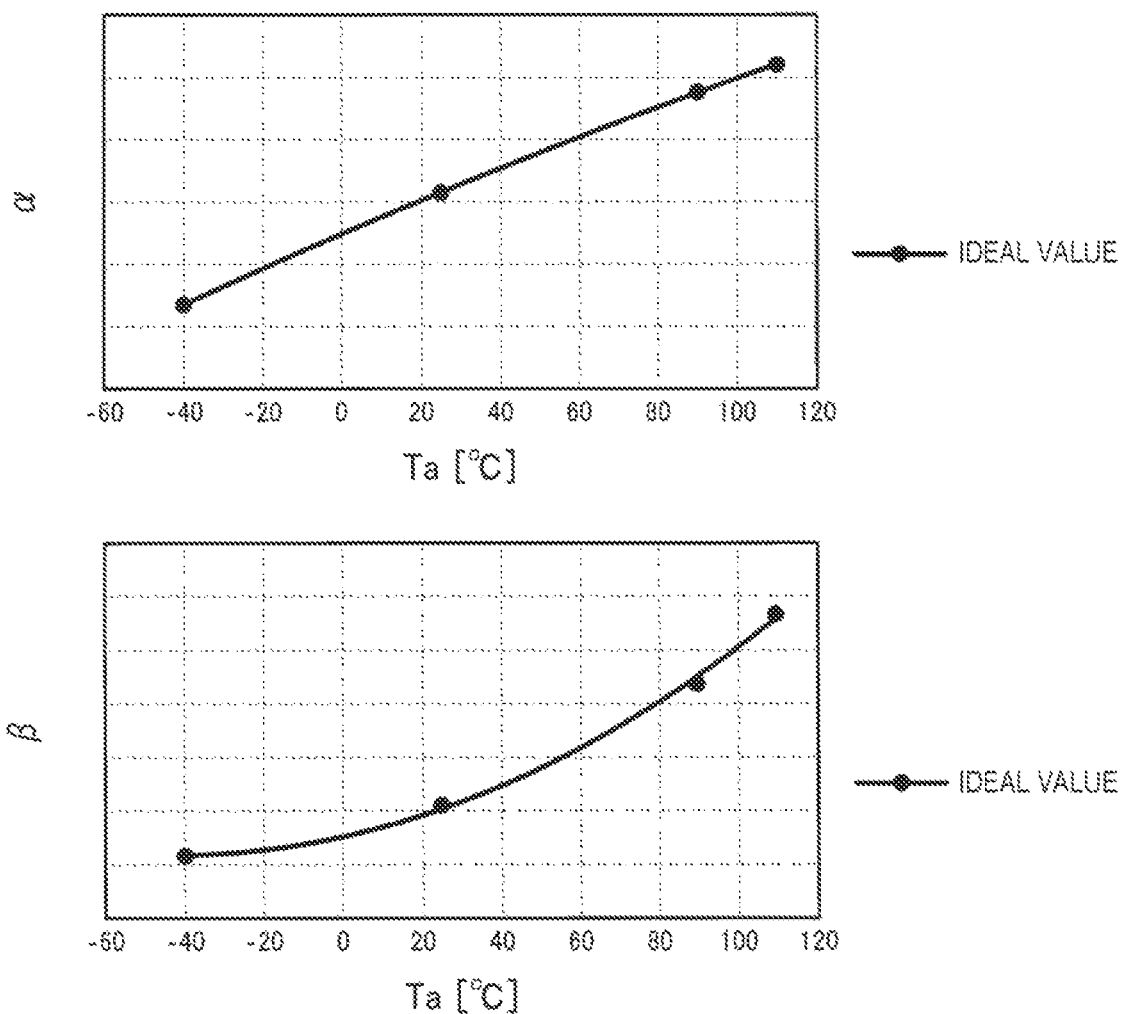
FIG. 15 is a diagram showing an example of temperature dependence of a slope $\alpha$ and an intercept $\beta$.

DFVm, which is the voltage sensor output frequency at each temperature, can be represented as a linear straight line having a slope $\alpha$ and an intercept $\beta$. Here, $\alpha$ of the slope and $\beta$ of the intercept are functions determined by the temperature. In FIG. 14, for example, Tm1 corresponds to −40 ° C., Tm2 corresponds to 25 20 C., Tm3 corresponds to 90° C., and Tm4 corresponds to 110° C. $\alpha$calc and $\beta$calc, which are ideal values of $\alpha$ and $\beta$ in the Equations (3) to (6), can be obtained from approximate expressions when $\alpha$ and $\beta$ are plotted on the vertical axis with the horizontal axis as the temperature. An upper part of FIG. 15 shows a relationship between $\alpha$ and the detection target temperature Ta when plotted with the detection target temperature Ta on the horizontal axis and $\alpha$ on the vertical axis. A lower part of FIG. 15 shows a relationship between $\beta$ and the detection target temperature Ta when plotted with the detection target temperature Ta on the horizontal axis and $\beta$ on the vertical axis. In the upper part of FIG. 15, $\alpha$ is obtained from the approximate expression for the data at each temperature as shown in Equation (7).

$$\alpha(Tcalc) = \alpha 2 \cdot Tcalc^2 + \alpha 1 \cdot Tcalc + \alpha 0 \quad (7)$$

Here, $\alpha 2$, $\alpha 1$, and $\alpha 0$ in Equation (7) are obtained from the approximate expression for the data in FIG. 15, and Ta on the horizontal axis uses the absolute temperature Tcalc corrected for the individual variation calculated in step S1. Similarly to the calculation of $\alpha$, $\beta$ of the intercept can also be obtained as shown in Equation (8) from an approximate expression for data at each temperature when the horizontal axis is the detection target temperature Ta and the vertical axis is $\beta$.

$$\beta(Tcalc) = \beta 2 \cdot Tcalc^2 + \beta 1 \cdot Tcalc + \beta 0 \quad (8)$$

As in the case of $\alpha$, $\beta 2$, $\beta 1$, and $\beta 0$ in equation (8) are obtained from the approximate expression for the data in FIG. 15, and the absolute temperature Tcalc is used for Ta on the horizontal axis.

As described above, the absolute voltage Vcalc can be obtained from Tcalc calculated in step S1, $\alpha$(Tcalc) and $\beta$(Tcalc) calculated in step S2, and DFV. Specifically, when DFVmeas is $\alpha$(Tcalc)×Vcalc+$\beta$(Tcalc), the absolute voltage Vcalc is represented by Equation (9).

$$Vcalc = \frac{DFVmeas - \beta(Tcalc)}{\alpha(Tcalc)} \quad (9)$$

Figure 16:
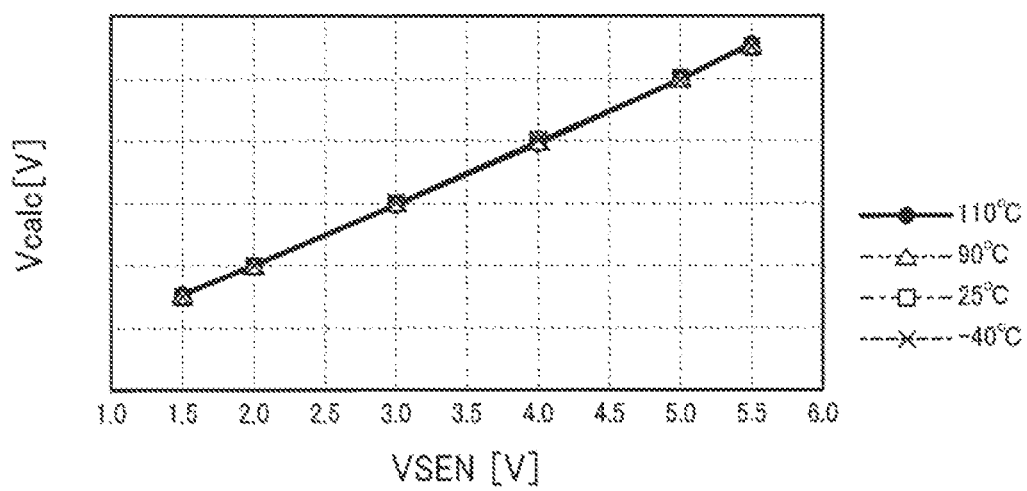
FIG. 16 is a diagram showing an example of a relationship between the detection target voltage and an absolute voltage at each temperature.

FIG. 16 is an example of plotting the value of the absolute voltage Vcalc with respect to the detection target voltage VSEN for the measurement data at each temperature. As shown in FIG. 16, when the absolute voltage Vcalc is corrected in step S2, the voltage detected with respect to the certain detection target voltage VSEN becomes the absolute voltage Vcalc independent of the temperature.

Figure 17:
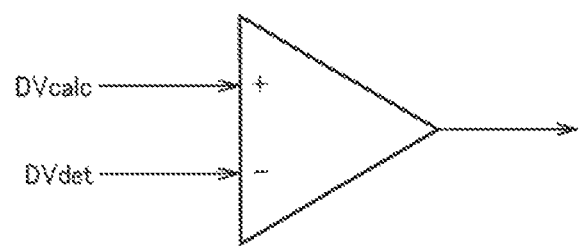
FIG. 17 is a diagram showing a method of comparing detection voltage data with reference voltage data.

Next, steps S3a to S3d will be described. First, in step S3a, the detection target temperature Ta and DFT, which is the temperature sensor output frequency, are measured for a plurality of samples. Then, in step S3b, for the certain sample m, the detection target voltage VSEN and DFV at the corresponding detection target voltage VSEN are measured for each temperature. In step S3c, the absolute voltage Vcalc is calculated using the correction equation for correcting the individual variation calculated in step S1 and the correction equation for correcting the absolute voltage calculated in step S2. Then, in step S3d, the detection target voltage VSEN is compared with the reference voltage. The detection target voltage VSEN is a voltage after being corrected to the absolute voltage Vcalc. The detection target voltage VSEN and a reference voltage Vdet are compared by comparing detection voltage data DVcalc corresponding to the detection target voltage VSEN and reference voltage data DVdet corresponding to the reference voltage Vdet. For example, as shown in FIG. 17, the detection voltage data DVcalc and the reference voltage data DVdet can be input to a comparator for determination. As described above, the correction algorithm according to the embodiment can obtain an absolute voltage corrected for the sample variation and the voltage variation for each device on which the circuit device 1 is mounted.

That is, in the embodiment, the calculation circuit 40 performs the correction process. When the first count value CT1 is DFV, the slope value when DFV is represented by the linear expression of the detection target voltage is $\alpha$, and the intercept of the linear expression is $\beta$, the detection voltage data subjected to the correction process is obtained by Vcalc=(DFV−$\beta$)/$\alpha$. $\alpha$ and $\beta$ are obtained based on the temperature data and information approximating the dependence of α and β on the temperature.

As described above, the ideal correspondence relationship between the first count value CT1 and the detection target voltage VSEN can be determined by the two parameters α and β. Since α and β can be obtained from an approximate curve of actual measurement data, the absolute voltage Vcalc after correcting the voltage variation can be obtained.

Further, in the embodiment, when the second count value is DFT, the slope value when DFT is represented by the linear expression of the temperature is A, the intercept of the linear expression is B, the target slope value is a, and the target intercept is b, the calculation circuit 40 obtains the corrected count value by DFTcalc=(a/A)×(DFT−B)+b, and obtains the temperature data by Tcalc=(DFTcalc−b)/a, thereby correcting the individual variation.

As described above, the ideal correspondence relationship between DFT of the second count value and the detection target temperature Ta can be determined by the two parameters a and b, and DFTcalc of the corrected count value can be calculated by using a and b and A and B obtained from the actual measurement data, and the temperature data in which the individual variation is corrected can be obtained based on DFTcalc.

In the embodiment, the calculation circuit 40 compares the reference voltage data DVdet corresponding to the reference voltage Vdet with the detection voltage data DVcalc to determine whether the detection target voltage VSEN is the reference voltage Vdet.

In this manner, the reference voltage Vdet and the detection target voltage VSEN can be compared in magnitude by comparing the reference voltage data DVdet and the detection voltage data DVcalc.

4. Oscillator

FIG. 18 is a configuration example of an oscillator 200 according to the embodiment. The oscillator 200 according to the embodiment includes the circuit device 1 and the resonator 210, and includes a power supply terminal TEVDD, a ground terminal TEGND, an output enable terminal TEOE, and a clock terminal TECK as external terminals. In the oscillator 200 according to the embodiment, the circuit device 1 includes a power supply circuit 90, an oscillation circuit 100, a temperature detection circuit 110, a voltage detection circuit 120, a logic circuit 130, and an output buffer circuit 140, and includes a power supply pad TVDD, a ground pad TGND, an output enable pad TOE, a clock pad TCK, and resonator coupling pads TX1 and TX2.

The temperature detection circuit 110 and the voltage detection circuit 120 are implemented by the current supply circuit 10, the oscillation circuit 20, the counter circuit 30, and the calculation circuit 40 described in FIGS. 1 and 2. For example, the current supply circuit 10 supplies the second current IB2 to the oscillation circuit 20, the counter circuit 30 outputs the second count value CT2 based on the clock signal RCK from the oscillation circuit 20, and the calculation circuit 40 performs the calculation operation of obtaining the temperature data DTT based on the second count value CT2, thereby implementing the temperature detection circuit 110 of FIG. 18. In addition, the current supply circuit 10 supplies the first current IB1 to the oscillation circuit 20, the counter circuit 30 outputs the first count value CT1 based on the clock signal RCK from the oscillation circuit 20, and the calculation circuit 40 performs the calculation operation of obtaining the detection voltage data DTV based on the first count value CT1, thereby implementing the voltage detection circuit 120 of FIG. 18. The counter circuit 30 and the calculation circuit 40 are actually provided in the logic circuit 130 of FIG. 18.

The resonator 210 is an element that generates mechanical oscillation by an electric signal, and can be implemented by a quartz crystal resonator element such as a tuning fork type quartz crystal resonator element or a double tuning fork type quartz crystal resonator element.

The power supply circuit 90 is supplied with the power supply voltage VDD from the power supply pad TVDD and supplies various power supply voltages to an internal circuit of the circuit device 1. The power supply voltage VDD is, for example, a voltage of 1.5 V to 3.6 V, and the above-described regulated voltage VREG is generated by stepping down the power supply voltage VDD.

The power supply pad TVDD of the circuit device 1 is a pad to which the power supply voltage VDD is supplied. For example, the power supply voltage VDD from an external power supply device is supplied to the power supply pad TVDD. The ground pad TGND is a pad to which GND, which is a ground voltage, is supplied. The GND can also be called VSS, and the ground voltage is, for example, a ground potential. The clock pad TCK is a pad to which an output signal of the circuit device 1 is output. The output enable pad TOE is a pad for controlling enable and disenable of the output of the circuit device 1. Each pad of the circuit device 1 is, for example, a pad in which a metal layer is exposed from a passivation film which is an insulating layer. The power supply pad TVDD, the ground pad TGND, the clock pad TCK, and the output enable pad TOE are electrically coupled to the power supply terminal TEVDD, the ground terminal TEGND, the clock terminal TECK, and the output enable terminal TEOE, respectively, which are external terminals for external coupling of the oscillator 200. For example, the circuit device 1 and the resonator 210 are electrically coupled using an internal wiring of a package that accommodates the the circuit device 1 and the resonator 210, a bonding wire, or a metal bump.

The oscillation circuit 100 controls oscillation of the resonator 210 and outputs an oscillation clock signal having a predetermined frequency. The clock signal CK in FIG. 18 is a clock signal corresponding to the oscillation clock signal. The oscillation circuit 100 includes a variable capacitance circuit 101, and a voltage applied to the resonator 210 is controlled by the variable capacitance circuit 101, so that the resonation of the resonator 210 can be controlled. The oscillation circuit 100 is electrically coupled to the pads TX1 and TX2, and generates an oscillation clock signal by oscillating the resonator 210. The frequency of the oscillation clock signal generated by the oscillation circuit 100 is, for example, 64 kHz. In the circuit device 1 according to the embodiment, a switch array and a capacitor array are provided in the variable capacitance circuit 101 of the oscillation circuit 100. By turning on and off switches of the switch array based on frequency adjustment data from the logic circuit 130, a capacitance of the variable capacitance circuit 101 is changed, and the oscillation frequency is adjusted. The frequency adjustment data is, for example, data used when the temperature compensation is performed. When the external temperature fluctuates, the fluctuation of the frequency of the resonator 210 due to the temperature fluctuation is compensated based on the frequency adjustment data, and the oscillation circuit 100 can always generate an oscillation clock signal having a constant frequency. A temperature compensated circuit 131 of the logic circuit 130 outputs the frequency adjustment data based on the temperature data from the temperature detection circuit 110. By adjusting the capacitance of the variable capacitance circuit 101 based on the frequency adjustment data from the temperature compensated circuit 131, the oscillation circuit 100 can generate an oscillation clock signal having a constant frequency. For example, the temperature compensated circuit 131 has a look-up table that receives the temperature data and outputs the frequency adjustment data, and the frequency adjustment data from the look-up table is output to the oscillation circuit 100. As described above, the oscillation frequency of the oscillation circuit 100 is adjusted, and the temperature compensation process is implemented.

The output buffer circuit 140 outputs an output clock signal CKQ based on the clock signal CK corresponding to the oscillation clock signal. For example, the output buffer circuit 140 buffers the clock signal CK as the output clock signal CKQ and outputs the output clock signal CKQ to the clock pad TCK. The output clock signal CKQ is output to the outside via the clock terminal TECK of the oscillator 200.

As described above, the oscillator 200 according to the embodiment includes the circuit device 1 and the resonator 210 for generating the setting clock signal CK for the given period.

As described above, the circuit device according to the embodiment includes an oscillation circuit, a current supply circuit, a counter circuit, and a calculation circuit. An oscillation frequency of the oscillation circuit changes according to a supply current. The current supply circuit supplies, to the oscillation circuit, a first current that changes according to a detection target voltage as the supply current.

The counter circuit performs a count process of counting an output signal of the oscillation circuit in a given period. The calculation circuit performs a voltage calculation process of calculating detection voltage data corresponding to the detection target voltage based on a first count value obtained in the count process in a state in which the first current is supplied to the oscillation circuit.

In this manner, the first current that changes according to the detection target voltage is supplied to the oscillation circuit, the output signal of the oscillation circuit whose oscillation frequency changes according to the first current is subjected to the count process in the given period, and the calculation process is performed based on the obtained first count value, so that the detection voltage data corresponding to the detection target voltage can be calculated. Accordingly, the detection accuracy of the detection target voltage can be adjusted by, for example, setting the length of the given period in which the count process is performed or changing the algorithm of the calculation process in the calculation circuit. The detection accuracy may not be restricted by performance of an analog circuit.

In the embodiment, the current supply circuit may include a first current generation circuit configured to generate the first current, a second current generation circuit configured to generate a second current that changes according to a temperature, and a current selector configured to supply, to the oscillation circuit, the first current or the second current as the supply current.

In this manner, when the detection target voltage is detected, the current selector selects the first current to obtain the detection voltage data corresponding to the detection target voltage, and when the temperature is detected, the current selector selects the second current to obtain temperature data corresponding to the temperature.

In the embodiment, the calculation circuit may perform a temperature calculation process of calculating the temperature data corresponding to the temperature based on a second count value obtained in the count process in the state in which the second current is supplied to the oscillation circuit.

In this manner, the counter circuit can output the second count value that changes according to the temperature to the calculation circuit, and the calculation circuit can perform the temperature calculation process based on the second count value that changes according to the temperature to calculate the temperature data corresponding to the temperature.

In the embodiment, the calculation circuit may perform the correction process based on the temperature data in the voltage calculation process to obtain the detection voltage data.

In this manner, the calculation circuit can effectively use the temperature data obtained based on the second count value to perform the correction process on the detection voltage data.

In the embodiment, the calculation circuit may correct a temperature variation of the detection voltage data with respect to the detection target voltage in the voltage calculation process based on the temperature data.

Accordingly, the calculation circuit can effectively use the temperature data obtained based on the second count value to implement the correction process of compensating for the temperature variation of the detection voltage data.

Further, in the embodiment, a storage unit configured to store a temperature correction coefficient for correcting the temperature variation may be included, and the calculation circuit may correct the detection voltage data based on the temperature correction coefficient stored in the storage unit.

In this manner, the temperature correction coefficient for correcting the temperature variation is stored in the storage unit, and the temperature variation of the detection voltage data can be corrected using the stored temperature correction coefficient.

The first count value is DFV, a slope value when DFV is represented by a linear expression of the detection target voltage is $\alpha$, and an intercept of the linear expression is $\beta$. At this time, the calculation circuit may obtain the detection voltage data by $Vcalc=(DFV-\beta)/\alpha$, and obtain $\alpha$ and $\beta$ based on the temperature data and information approximating the dependence of $\alpha$ and $\beta$ on the temperature.

As described above, the ideal correspondence relationship between DFV of the first count value and the detection target voltage can be determined by the two parameters $\alpha$ and $\beta$. Since $\alpha$ and $\beta$ can be obtained from an approximate curve of actual measurement data, the absolute voltage Vcalc after correcting the voltage variation can be obtained.

In the embodiment, the calculation circuit may correct an individual variation of the temperature data with respect to the temperature in the temperature calculation process.

As described above, when the individual variation of the temperature data is corrected, it is possible to obtain the temperature data as the absolute temperature from which the individual variation is eliminated.

Further, in the embodiment, the circuit device may include a storage unit configured to store an individual variation correction coefficient for correcting the individual variation, and the calculation circuit may correct the temperature data based on the individual variation correction coefficient stored in the storage unit.

In this manner, the temperature correction coefficient for correcting the individual variation is stored in the storage unit, and the individual variation of the temperature data can be corrected using the stored temperature correction coefficient.

Further, in the embodiment, when the second count value is DFT, the slope value when DFT is represented by a linear expression of the temperature is A, an intercept of the linear expression is B, a target slope value is a, and a target intercept is b, the calculation circuit may correct the individual variation by obtaining a corrected count value by DFTcalc=(a/A)×(DFT−B)+b, and obtaining the temperature data by Tcalc=(DFTcalc−b)/a.

As described above, the ideal correspondence relationship between DFT of the second count value and the detection target temperature can be determined by the two parameters a and b, and the corrected count value can be calculated by using a and b and A and B obtained from the actual measurement data, and the absolute temperature from which the individual variation is eliminated can be obtained based on the corrected count value.

In the embodiment, the calculation circuit may compare reference voltage data corresponding to a reference voltage with the detection voltage data to determine whether the detection target voltage is the reference voltage.

In this manner, whether the detection target voltage exceeds or falls below the reference voltage corresponding to the reference voltage data can be output as the determination result.

In the embodiment, the current supply circuit may include a selector configured to select and output the detection target voltage from a plurality of voltages including a first power supply voltage and a second power supply voltage.

In this manner, a voltage to be detected from the plurality of voltages can be selected by the selector as the detection target voltage.

In the embodiment, the oscillation circuit may be a ring oscillator.

In this manner, the oscillation frequency of the ring oscillator is controlled by the supply current from the current supply circuit, so that the count value corresponding to the supply current is output from the counter circuit, and the detection voltage data and the like can be obtained.

The embodiment relates to an oscillator including: the circuit device; and a resonator configured to generate a setting clock signal of the given period.

Although the embodiment has been described in detail above, it will be easily understood by those skilled in the art that many modifications can be made without substantially departing from the novel matters and effects according to the present disclosure. Accordingly, such modifications are intended to be included in the scope of the present disclosure. For example, a term cited with a different term having a broader meaning or the same meaning at least once in the description or the drawings can be replaced with the different term at any place in the description or the drawings. In addition, all combinations of the embodiment and the modifications are also within the scope of the present disclosure. The configurations, operations, and the like of the circuit device and the oscillator are not limited to those described in the embodiment, and various modifications can be made.

What is claimed is:

1. A circuit device comprising:
    an oscillation circuit whose oscillation frequency changes according to a supply current;
    a current supply circuit configured to selectively supply, to the oscillation circuit, one of a first current that changes according to a detection target voltage and a second current that changes according to a temperature as the supply current;
    a counter circuit configured to perform a count process of counting an output signal of the oscillation circuit in a given period; and
    a calculation circuit configured to perform a voltage calculation process of calculating detection voltage data corresponding to the detection target voltage based on a first count value obtained in the count process in a state in which the first current is supplied to the oscillation circuit.

2. The circuit device according to claim 1, wherein the current supply circuit includes:
    a first current generation circuit configured to generate the first current;
    a second current generation circuit configured to generate the second current; and
    a current selector configured to supply, to the oscillation circuit, one of the first current or the second current as the supply current.

3. The circuit device according to claim 1, wherein
    the calculation circuit is configured to perform a temperature calculation process of calculating temperature data corresponding to the temperature based on a second count value obtained in the count process in a state in which the second current is supplied to the oscillation circuit.

4. The circuit device according to claim 3, wherein
    the calculation circuit is configured to perform a correction process based on the temperature data in the voltage calculation process to obtain the detection voltage data.

5. The circuit device according to claim 4, wherein
    the calculation circuit is configured to correct a temperature variation of the detection voltage data with respect to the detection target voltage in the voltage calculation process based on the temperature data.

6. The circuit device according to claim 5, further comprising:
    a storage unit configured to store a temperature correction coefficient for correcting the temperature variation, wherein
    the calculation circuit is configured to correct the detection voltage data based on the temperature correction coefficient stored in the storage unit.

7. The circuit device according to claim 4, wherein
    when the first count value is DFV, a slope value when DFV is represented by a linear expression of the detection target voltage is α, and an intercept of the linear expression is β,
    the calculation circuit is configured to perform the correction process by obtaining α and β based on the temperature data and information approximating dependence of α and β on the temperature, and obtaining the detection voltage data by Vcalc=(DFV−β)/α.

8. The circuit device according to claim 3, wherein
    the calculation circuit is configured to correct an individual variation of the temperature data with respect to the temperature in the temperature calculation process.

9. The circuit device according to claim 8, wherein
    the circuit device includes a storage unit configured to store an individual variation correction coefficient for correcting the individual variation, and
    the calculation circuit is configured to correct the temperature data based on the individual variation correction coefficient stored in the storage unit.

10. The circuit device according to claim 8, wherein
when the second count value is DFT, a slope value when DFT is represented by a linear expression of the temperature is A, an intercept of the linear expression is B, a target slope value is a, and a target intercept is b,
the calculation circuit is configured to correct the individual variation by obtaining a corrected count value by DFTcalc=(a/A)×(DFT-B)+b, and obtaining the temperature data by Tcalc=(DFTcalc-b)/a.

11. The circuit device according to claim 1, wherein
the calculation circuit is configured to compare reference voltage data corresponding to a reference voltage with the detection voltage data to determine whether the detection target voltage is the reference voltage.

12. The circuit device according to claim 1, wherein
the current supply circuit includes a selector configured to select and output the detection target voltage from a plurality of voltages including a first power supply voltage and a second power supply voltage.

13. The circuit device according to claim 1, wherein
the oscillation circuit is a ring oscillator.

14. An oscillator comprising:
the circuit device according to claim 1; and
a resonator configured to generate a setting clock signal of the given period.

* * * * *